United States Patent [19]
Dinh

[11] Patent Number: 6,038,276
[45] Date of Patent: Mar. 14, 2000

[54] DIGITAL PHASE LOCK LOOP FOR NON-CONTINUOUS REFERENCE SIGNAL

[76] Inventor: Truong T. Dinh, 12777 Cherrywood State, Poway, Calif. 92064

[21] Appl. No.: 08/918,435

[22] Filed: Aug. 26, 1997

[51] Int. Cl.[7] .................................................. H03D 3/24
[52] U.S. Cl. ............................ 375/376; 327/156; 348/507
[58] Field of Search ............................ 375/215, 226, 375/374, 375, 376; 327/156, 159; 348/507, 510, 303

[56] References Cited

U.S. PATENT DOCUMENTS

| | | | |
|---|---|---|---|
| 4,560,950 | 12/1985 | Cabot | 331/1 A |
| 5,008,635 | 4/1991 | Hanke et al. | 331/1 A |
| 5,124,669 | 6/1992 | Palmer et al. | 331/1 A |
| 5,410,573 | 4/1995 | Taga et al. | 375/376 |
| 5,459,524 | 10/1995 | Cooper | 348/507 |
| 5,686,864 | 11/1997 | Martin et al. | 331/1 A |
| 5,768,328 | 6/1998 | Nielsen | 375/376 |
| 5,784,122 | 7/1998 | Nayebi et al. | 348/549 |

*Primary Examiner*—Wellington Chin
*Assistant Examiner*—Congvan Tran
*Attorney, Agent, or Firm*—Truong T. Dinh

[57] ABSTRACT

A phase lock loop which locks a numerically controlled oscillator (NCO) to a non-continuous reference signal. The phase of the reference signal is ascertained by detecting the zero crossings of the signal. The zero crossing is provided to a phase detector which compares the phase of the NCO with that of the reference signal. The phase detector generates a phase error which is provided to a loop filter. The loop filter filters the phase error and provides a control signal to the NCO. The phase detector is enabled for the duration corresponding to the time when the reference signal contains valid phase information. A mechanism detects bad reference cycles and removes the phase error corresponding to these bad reference cycles from consideration. Another mechanism detects phase locked by the phase lock loop by measuring the width of the reference cycles within the duration when the reference signal is valid.

28 Claims, 9 Drawing Sheets

DIGITAL PHASE LOCK LOOP FOR NON-CONTINUOUS REFERENCE SIGNAL

BACKGROUND OF THE INVENTION

I. Field of the Invention

The present invention relates to a phase lock loop. More particularly, the present invention relates to a novel and improved digital phase lock loop (PLL) which locks a numerically controlled oscillator (NCO) to a non-continuous reference signal.

II. Description of the Related Art

The emergence of digital video has brought many benefits to the consumers. Digital video has many desirable characteristics such as multiple programs and improved picture quality. The use of complex digital compression techniques allows multiple programs (up to six or ten programs depending on the desired video quality) to be transmitted on a single 6.2 MHz channel. Digital transmission allows the reception of the video signal at a lower signal-to-noise ratio than with analog transmission. The lower threshold allows the use of a smaller satellite dish to receive the digital transmission over a satellite link. In addition, digital video allows easy incorporation of graphical features and text in the video signal because the digital processing capability is present in the digital video system. In the interim period, until digital video completely displaces analog video, a vast number of existing video services provide analog video. A digital video system which desires to incorporate existing analog programs among its programming features needs to receive analog video as well as digital video.

For digital video, the data representing the video picture is transformed into a signal which the television accepts. In a digital video system, this function is performed by a video encoder. The video encoder receives the data for the luminance and chrominance components, modulates the chrominance components by a color subcarrier to obtain a chrominance signal, adds the chrominance signal to the luminance component to obtain a digital signal, filters the digital signal, and converts the filtered signal into an analog video signal. In the U.S., the analog video signal conforms to the National Television Standard Committee (NTSC) format. In Europe and South America, the analog video signal conforms to the Phase Alternating Line (PAL) format.

For NTSC signal, the frequency of the color subcarrier is specified to be 3.579545 MHz±5 Hz. For PAL signal, the frequency of the color subcarrier is different for different versions of PAL. For example, for PAL-B, D, G, H, and I which are used in Europe, the color subcarrier is 4.433618 MHz. The color subcarrier is digitally generated within the video encoder by a direct digital synthesizer comprising a numerically controlled oscillator (NCO) and a sine look-up table which is commonly referred to as a color look-up table (CLUT). For each system clock cycle, the NCO accumulator is updated and the content of the NCO accumulator is used to address the CLUT. The NCO accumulator contains the phase of the color subcarrier and the CLUT transforms the phase information into the corresponding sinusoidal amplitude of the color subcarrier.

Graphical user interface (GUI) is an important feature of a digital video system. The GUI allows the consumers to perform complicated programming tasks on the digital video system through simple to understand commands which are graphically displayed on the television screen. The GUI can comprise graphics, text, or a combination of graphics and text arranged in an easy to understand and use display. The graphics and text are typically generated by a microcomputer or a GUI engine. The generated graphics and/or text are then stored in memory and sent to the video encoder at the appropriate time. The video encoder encodes the digital representation of the graphics and text into a corresponding analog signal which the television accepts.

In a digital video system, the digital data representing the video is quantized at a predetermined rate. Subsequent signal processing on the digital data is performed at a rate which is typically a multiple of the quantization rate. For Motion Picture Encoding Group (MPEG) standard, the video is quantized at 13.5 MHz and many signal processing steps are performed at 27 MHz. To simplify the GUI generation, the GUI is typically generated at the same 13.5 MHz data rate as the video data. The graphics and text for the GUI are multiplexed with the video data and sent to the video encoder.

A challenge arises when a digital video system is designed to support both digital video and analog video. When operating in the analog mode, the digital video system receives the frequency modulated (FM) signal, demodulates the FM signal to obtain the analog NTSC or PAL video signal, filters and amplifies the video signal, and provides the video signal to the television. Since the digital video system has the signal processing capabilities to generate GUI in the digital mode, it is desirable to have the same GUI be available during the analog mode. The use of the same GUI interface in both analog and digital video modes makes the video system more user friendly. A user does not have to learn different programming commands depending on whether the user is watching video from an analog source or a digital source.

In one approach used in the prior art to incorporate GUI on the analog video signal, a 14.318 MHz oscillator is locked to the color bursts of the analog video signal. For an NTSC signal, color bursts appear for nine cycles per active video line (each line is 227.5 cycles wide). In this specification, an active video line is a video line which contains color bursts. The 14.318 MHz oscillator is precisely four times the color burst frequency and can easily be phase locked to the color burst using a gated phase lock loop. The gated phase lock loop is only enabled for the duration when the color bursts are present. A continuous 14.318 MHz clock is then generated by buffering the output of the 14.318 MHz oscillator. The continuous 14.318 MHz clock is provided to the video encoder. The video encoder digitally locks the NCO to the continuous 14.318 MHz clock through a second phase lock loop.

This technique for locking the NCO within the video encoder to the color bursts of the analog video signal requires two phase lock loops. The dual loops approach requires a complex hardware design which results in higher cost. The dual loops approach is inherently more unreliable than a single loop approach. Furthermore, the dual loops approach has a longer acquisition time which is defined as the time required to lock the NCO to the analog video signal. The present invention addresses these shortcomings by using a single phase lock loop design to lock the NCO to a non-continuous reference signal.

SUMMARY OF THE INVENTION

The present invention is a novel and improved phase lock loop which locks a numerically controlled oscillator (NCO) to a non-continuous reference signal which is valid for predetermined durations. In the exemplary embodiment, the phase of the reference signal is ascertained by detecting the zero crossings of the signal. The signal containing the zero crossings is provided to a phase detector which compares the phase of the NCO with that of the reference signal and generates a phase error. In the exemplary embodiment, the phase detector is enabled for the predetermined duration corresponding to the time when the reference signal contains valid phase information. In the exemplary embodiment, the phase error for all sinusoids within each predetermined duration is accumulated. The phase error from the phase detector is provided to a loop filter which filters the error with a loop filter transfer function. The control signal from the loop filter comprises the estimate of the instantaneous frequency of the reference signal. The control signal or frequency is provided to the NCO which accumulates the frequency over each cycle of a system clock. The NCO provides the NCO phase to other circuits within the system.

The present invention is especially suited for video applications wherein the color bursts appear for a predetermined number of cycles for each active video line. For NTSC signal, each active video line comprises nine color bursts. For PAL signal, the number of color burst varies depending on the version of PAL. Also in PAL, the phase of the color bursts alternates by 90 degrees over consecutive video lines. The present invention can be adopted to handle different input signal conditions. In addition, the video signal can be drastically degraded due to noise in the transmission link. The present invention can provide a mechanism to achieve and maintain lock despite adverse operating conditions.

It is an object of the invention to provide a phase detector and loop filter which can operate on a non-continuous reference signal which is valid for predetermined durations at predetermined locations in time. In the exemplary embodiment, for NTSC signal, the color bursts appear for nine cycles for each active video line. In the exemplary embodiment, a timing signal is generated which enables the phase detector and the loop filter for the duration when the color bursts are valid. By enabling the phase detector and loop filter such that these circuits are active only when the color bursts are valid, a gated phase lock loop can be created.

It is another object of the invention to provide a phase lock loop which can lock an NCO to a non-continuous reference signal utilizing one loop. In the exemplary embodiment, the phase error between the reference signal and the NCO is determined and provided to the loop filter. The loop filter filters the phase error and provides the control signal directly to the NCO. Because the phase detector and loop filter of the present invention are operated in a time gated manner, the control signal can be used to control the NCO directly without the use of a second phase lock loop.

It is yet another object of the present invention to provide a mechanism for detecting bad reference cycles and to remove the phase error corresponding to these bad reference cycles from consideration. In the exemplary embodiment, the width of each reference cycle is measured and compared against a first predetermined range. If the width of the reference cycle falls outside this range, a bad reference cycle is declared and the phase error corresponding to this predetermined duration is removed from consideration. For NTSC signal, each color burst has a width of 7.54 cycles of the 27 MHz clock. In the exemplary embodiment, color bursts with width of less than seven or greater than eight 27 MHz clock cycles are declared as bad color bursts and removed from consideration.

It is yet another object of the invention to provide a mechanism for detecting phase lock by the phase lock loop. In the exemplary embodiment, the width of the nine color bursts are measured and compared against a second predetermined range. If the measured width falls outside the range, a bad burst line is declared. In the exemplary embodiment, the number of bad burst lines for each video frame is counted and compared against a predetermined threshold. If the number of bad burst lines in a video frame exceeds the threshold, a loss of lock condition is declared. In the exemplary embodiment, the frequency from the loop filter is compared against a third predetermined range. If the frequency falls outside the range, a loss of lock condition is also declared.

The foregoing, together with other objects, features and advantages of this invention, will become more apparent when referring to the following specification, claims and the accompanying drawings.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
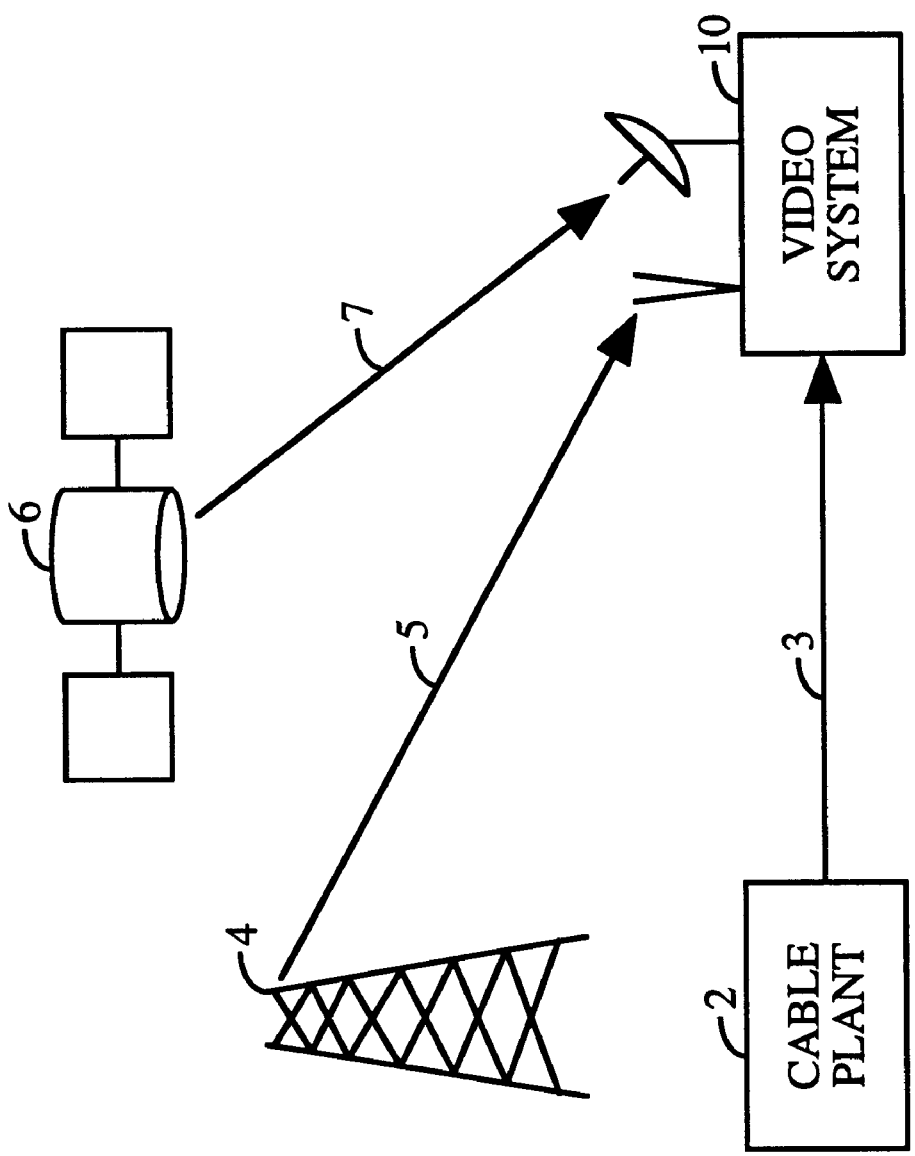
FIG. 1 is a diagram of an exemplary video communication system.

Referring to the figures, FIG. 1 illustrates an exemplary video system of the present invention. Video system 10 can receive analog or digital video signal from one or more sources. For example, video system 10 can receive analog or digital video signal from cable plant 2 through cable 3, from television station 4 through terrestrial link 5, or from satellite 6 through satellite link 7. Video system 10 can be designed to allow a user to view video from any one of these sources.

Figure 2:
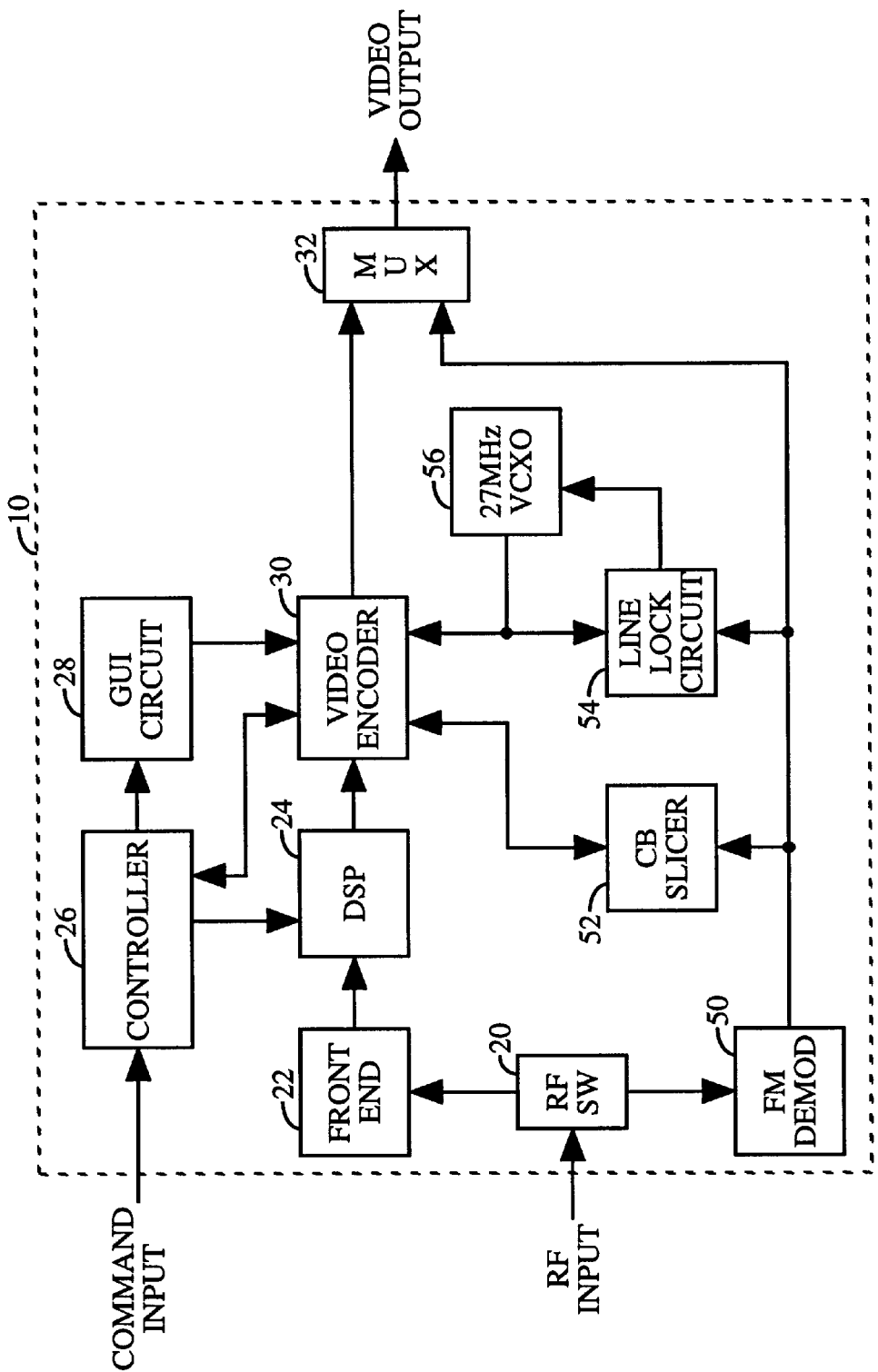
FIG. 2 is a block diagram of an exemplary video system of the present invention.

An exemplary block diagram of video system 10 is illustrated in FIG. 2. Video system 10 receives an RF input from one or more transmitting sources as shown in FIG. 1. The RF input is provided to RF switch (RF SW) 20 which directs the RF signal to the proper signal processing unit depending on whether the RF input contains an analog or a digital video signal. Specifically, RF switch 20 directs the RF input to front end 22 if the RF input contains a digital video signal and to FM demodulator (FM DEMOD) 50 if the RF input contains an analog video signal.

For a digital video signal, front end 22 filters, amplifies, and downconverts the RF input. The resultant signal is quantized and the digital data is provided to digital signal processor (DSP) 24. DSP 24 decodes the digital data using a decoding format which is the inverse of the encoding format used at the transmitting source. The decoding processing can comprise convolutional decoding and Reed-Solomon decoding. In the exemplary embodiment, the decoded data is then decompressed in accordance with MPEG standard to obtain the digital components which comprise the luminance component and the CR and CB chrominance components. The decompression can comprise the steps of inverse Fourier (or Cosine) transform, run length decoding, motion compensation, and any number of video decompression techniques which are known and used in the art. The digital components are provided to video encoder 30. Video encoder 30 modulates the CR and CB chrominance components to obtain the chrominance signal, adds the chrominance signal to the luminance component to obtain a digital signal, filters the digital signal, converts the filtered signal to an analog video signal, and provides the analog video signal to a viewing device (such as a television) through multiplexer (MUX) 32. MUX 32 selects the analog video signal from either video encoder 30 or FM DEMOD 50, depending on whether the RF input contains a digital video signal or an analog video signal, respectively.

Controller 26 receives the command input and controls the digital signal processing within DSP 24 and the GUI generation within GUI circuit 28 in response to the command input. For example, the command input can request a GUI screen to be generated and provided to the viewing device. Controller 26 then directs GUI circuit 28 to generate the desired GUI screen which is then provided to video encoder 30. Video encoder 30 can overlay the GUI screen over the video signal and provides the composite signal. Controller 26 can be implemented with a microcontroller, a microprocessor, a digital signal processing (DSP) chip, or an ASIC programmed to perform the function as described herein.

Figure 8:
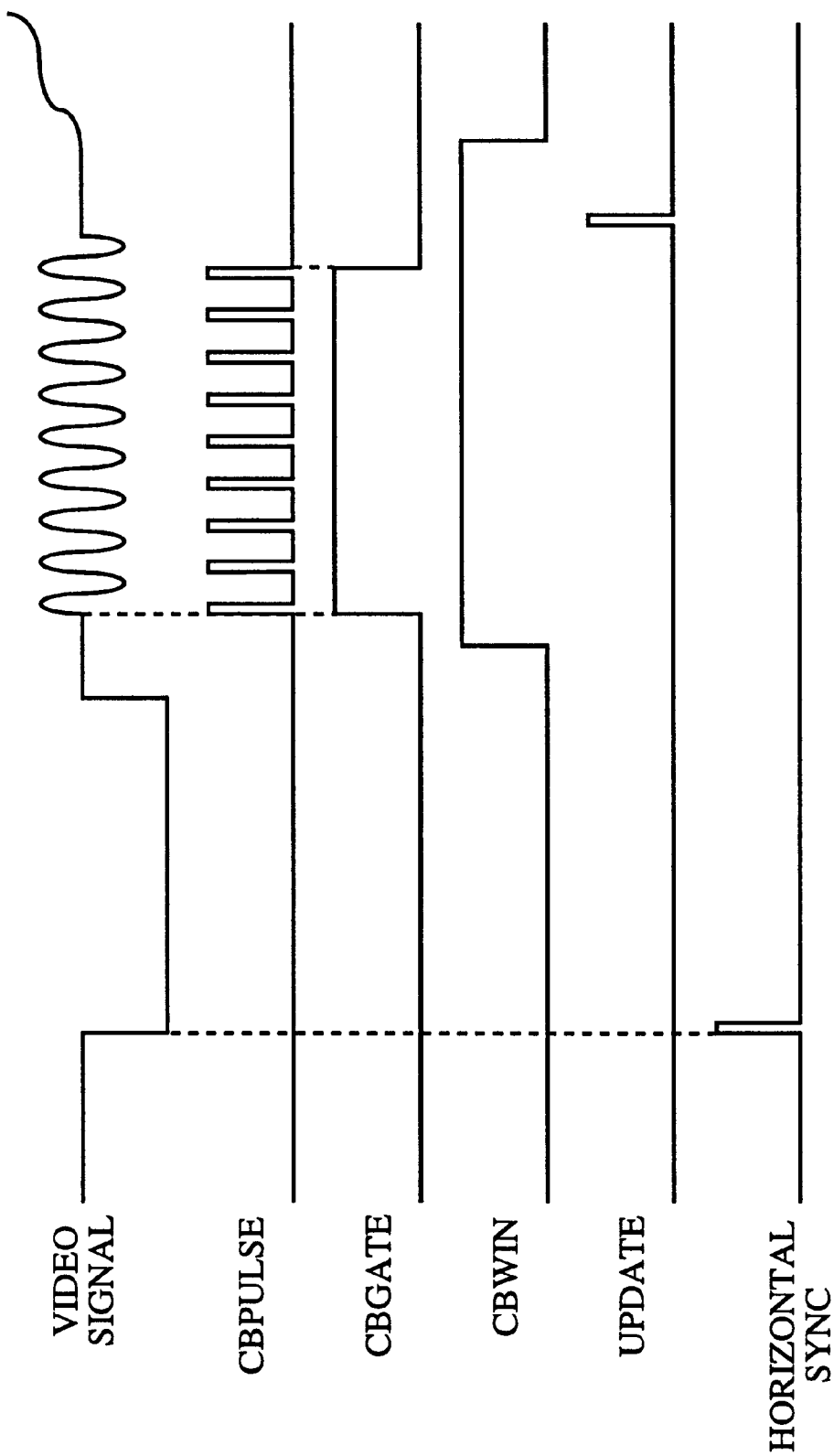
FIG. 8 is a timing diagram of the exemplary timing signal utilized by the circuits of present invention.

If the RF input contains an analog video signal, FM DEMOD 50 filters, amplifies, and FM demodulates the RF input. The analog video signal from FM DEMOD 50 is multiplexed through MUX 32 and provided to the viewing device. The analog video signal is also provided to color burst (CB) slicer 52 and line lock circuit 54. CB slicer 52 generates the COLOR BURST signal from the analog video signal. In the exemplary embodiment, CB slicer 52 can be implemented by AC coupling the analog video signal and providing the AC coupled signal to a comparator. The comparator outputs a logic one (high) if the AC coupled signal is above a reference voltage and a logic zero (low) if the AC coupled signal is below the reference voltage. In the exemplary embodiment, the COLOR BURST signal contains a logic low to high transition whenever the color burst of the analog video signal crosses 0 IRE from low to high, where IRE is a unit of measurement defined by NTSC. Similarly, the COLOR BURST signal contains a logic high to low transition whenever the color burst of the analog video signal crosses 0 IRE from high to low. The transitions in the COLOR BURST signal correspond to the zero crossings of the color bursts within the analog video signal and, therefore, contain the phase information of the color burst. The COLOR BURST signal from CB slicer 52 is used in the chroma genlock circuit of the present invention as described below. Line lock circuit 54 also receives the analog video signal and generates the HORIZONTAL SYNC signal. In the exemplary embodiment, the HORIZONTAL SYNC signal is derived by slicing the sync tip of the analog video signal. In the exemplary embodiment, the slicing point is selected to be −20 IRE which is the mid point between sync tip (−40 IRE) and blanking level (0 IRE). The HORIZONTAL SYNC signal comprises pulses which appear once every video line, except during the vertical blanking interval (VBI) where two pulses are present on each video line. In the exemplary embodiment, the pulses on the HORIZONTAL SYNC signal have a width of one 27 MHz clock cycle and is aligned to the leading edge of sync tip, as shown in FIG. 8. The HORIZONTAL SYNC signal is used to line locked the 27 MHz voltage controlled crystal oscillator (VCXO) 56 to the line frequency of the analog video signal. The 27 MHz clock from the 27 MHz VCXO 56 is provided to video encoder 30 and line lock circuit 54 and is used as the system clock by these circuits.

Figure 3:
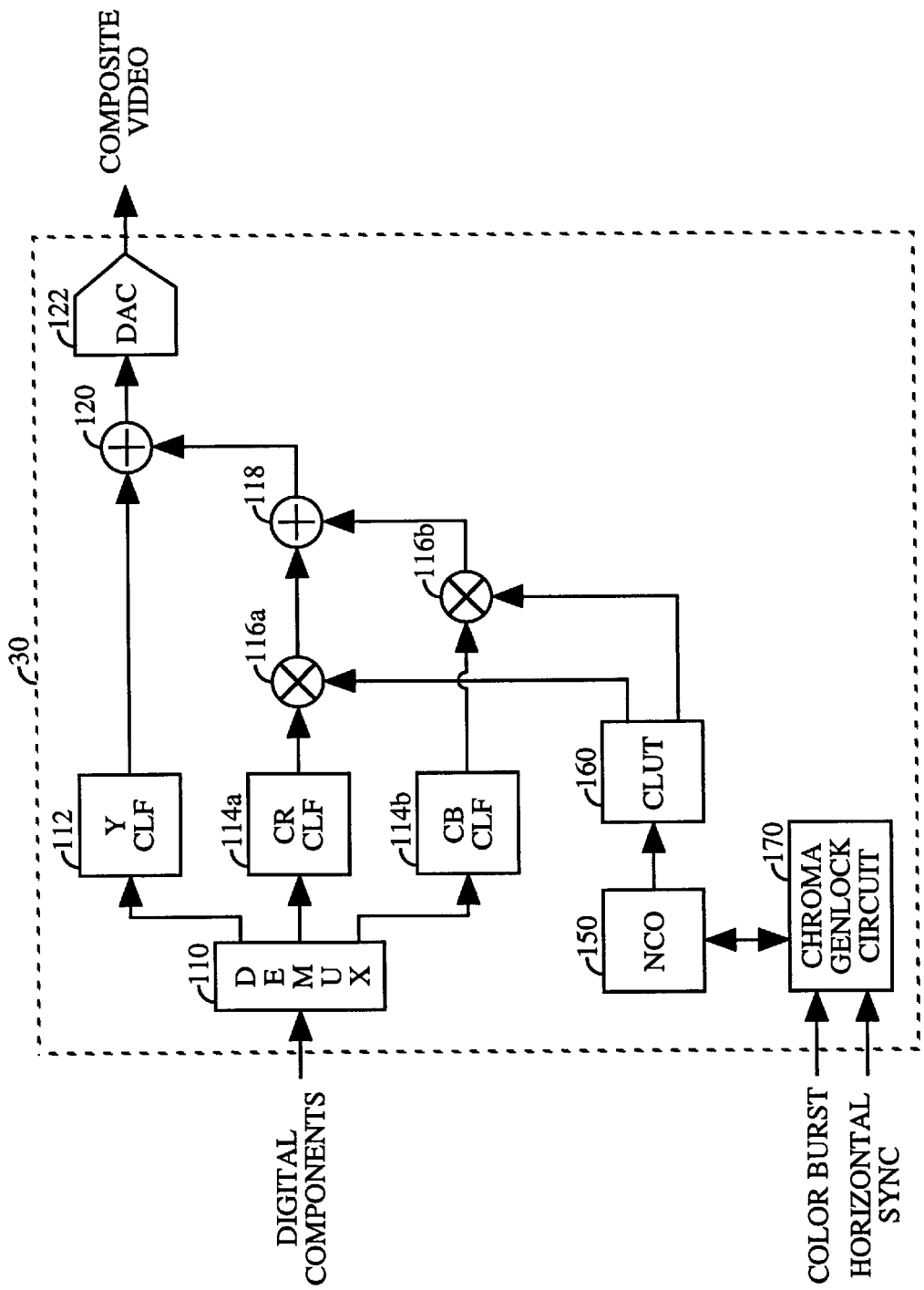
FIG. 3 is a block diagram of an exemplary video encoder of the present invention.

An exemplary block diagram of video encoder 30 is shown in FIG. 3. The digital components from DSP 24 comprise the Y luminance and CR and CB chrominance components in a time multiplexed signal. For example, the digital components can be in the following format Y1, CR1, Y2, CB1, Y3, CR2, Y4, CB2, Y5, and so on. The Y luminance and CR and CB chrominance components are provided to Y lowpass filter (Y LPF) 112, CR LPF 114a, and CB LPF 114b, respectively, through demultiplexer (DEMUX) 110. Y LPF 112 filters the luminance component and CR LPF 114a and CB LPF 114b filter the CR and CB components, respectively. The filtered CR component is modulated with an in-phase color subcarrier by multiplier 116a and the filtered CB component is modulated with a quadrature color subcarrier by multiplier 116b. The modulated CR and CB signals are summed together by adder 118 to obtain the chrominance signal. The filtered luminance component and the chrominance signal are summed by adder 120 to obtain the digital signal. The digital signal is converted to an analog video signal by digital-to-analog-converter (DAC) 122. The analog video signal is provided to MUX 32, as shown in FIG. 2.

NCO 150 digitally generates the phase of the color subcarrier. In the exemplary embodiment, NCO 150 is implemented as an accumulator which accumulates a frequency value with every system clock cycle. The content of the NCO accumulator comprises the phase of the NCO. The accumulator overflows when the accumulated phase exceeds two pi and the overflow bit, or the carryout bit, is discarded. The frequency value corresponds to the frequency of the color subcarrier and can be calculated in accordance with the following equation:

$$f_{cb} = \frac{NCO_{freq}}{NCO_{max}} \cdot f_{clk}, \quad (1)$$

where $f_{cb}$ is the frequency of the color subcarrier, $f_{clk}$ is the frequency of the system clock, $NCO_{freq}$ is the frequency value which is accumulated with each system clock cycle, and $NCO_{max}$ is the size of the NCO accumulator. As an example, for a color subcarrier of 3.579545 MHz using a 27 MHz system clock and a 22-bit NCO accumulator, the frequency value (NCO frequency) is 556,062 or 3,579,545·$2^{22}$/27,000,000.

NCO 150 provides the phase of the color subcarrier to color look-up table (CLUT) 160. CLUT 60 maps the phase of the color subcarrier to corresponding amplitude values or the in-phase and quadrature color subcarriers which are used to modulate the filtered CR and CB components, respectively. CLUT 160 can be implemented with a ROM look-up table or logic. Although not shown in FIG. 3 for simplicity, the 27 MHz clock from 27 MHz VCXO 56 is provided to each synchronous logic block in video encoder 30.

In analog video mode, chroma genlock circuit 170 receives the COLOR BURST signal from CB slicer 52 and the HORIZONTAL SYNC signal from line lock circuit 54 and phase locks NCO 150 to the color bursts of the analog video signal. Once phase locked, a digital image or GUI can be provided to video encoder 30. The composite signal from video encoder 30 can be overlay on or multiplexed with the analog video signal.

I. Chroma Genlock Circuit

Figure 4:
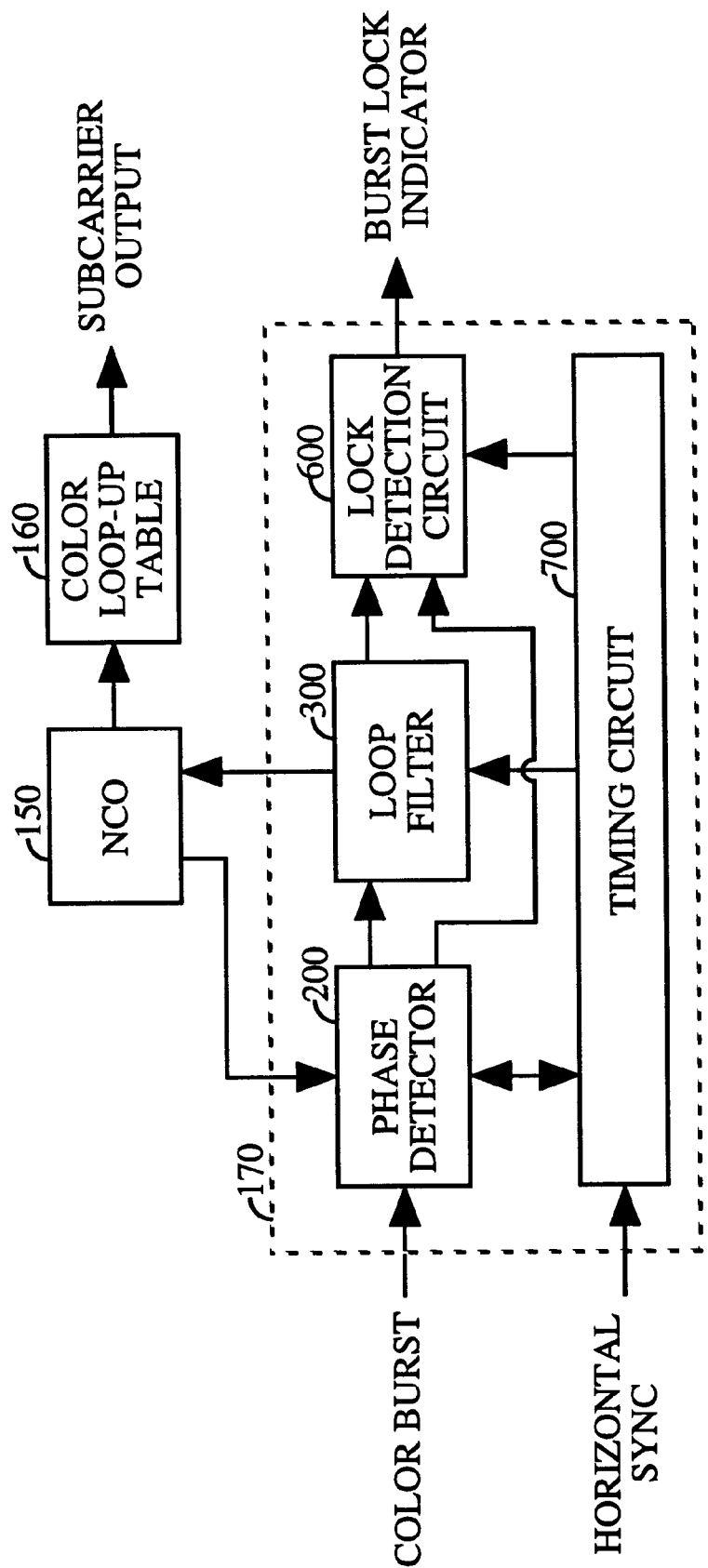
FIG. 4 is a block diagram of an exemplary chroma genlock circuit of the present invention.

An exemplary block diagram of chroma genlock circuit 170 of the present invention is shown in FIG. 4. Timing circuit 700 receives the HORIZONTAL SYNC signal from line lock circuit 54 and the 27 MHz clock from 27 MHz VCXO 56 (not shown in FIG. 4 for simplicity) and provides the necessary timing signals to other circuits within chroma genlock circuit 170. A discussion of timing circuit 700 is given below. Phase detector 200 receives the COLOR BURST signal from CB slicer 52 and the phase information from NCO 150 and determines the phase error between the color bursts and the NCO. The phase error is provided to loop filter 300 which filters the phase error and provides a control signal to NCO 150. NCO 150 adjusts the phase of the color subcarrier, in accordance with the control signal, to match the phase of the NCO to that of the color bursts. Phase detector 200 also provides a signal to lock detection circuit 600 which provides the BURST LOCK INDICATOR signal which indicates whether the color subcarrier is phase locked to the color burst.

Figure 5:
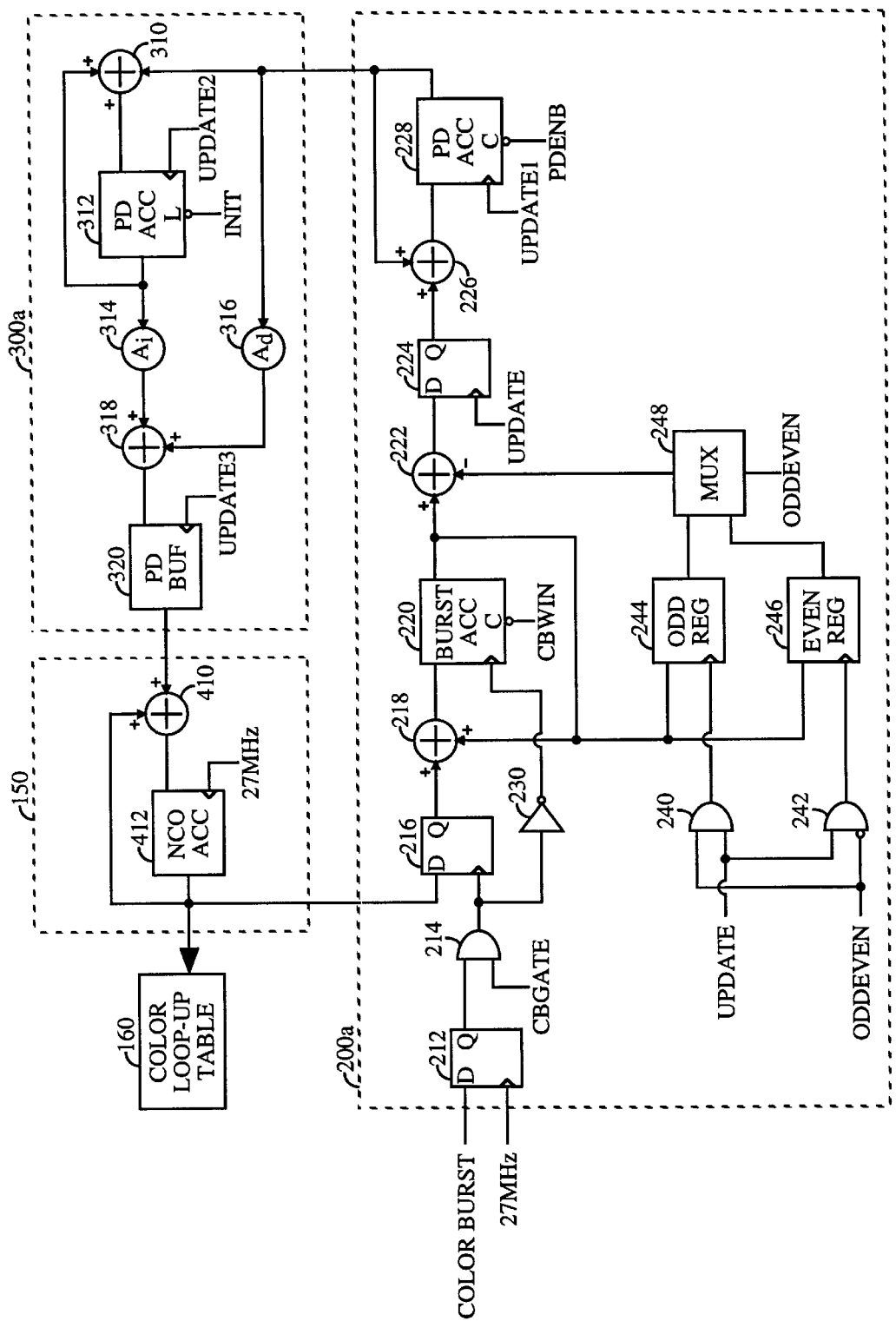
FIG. 5 is a schematic diagram of an exemplary chroma genlock circuit of the present invention.

A schematics diagram of the exemplary chrominance genlock circuit 170 of the present invention is shown in FIG. 5. Phase detector 200 and loop filter 300 in FIG. 4 are implemented as phase detector 200a and loop filter 300a in FIG. 5, respectively. Within phase detector 200a, the COLOR BURST signal from CB slicer 52 is provided to D flip-flop 212 which samples the signal with the 27 MHz clock. The output from D flip-flop 212 is provided to AND gate 214 which also receives the CBGATE signal. The CBGATE is active only during the portion of time when color bursts are present in the analog video signal (see FIG. 8). CBGATE and other timing signals are generated by timing circuit 700 and described below. The AND function removes extraneous edges from the COLOR BURST signal. In the exemplary embodiment, for NTSC signal, the output from AND gate 214 comprises nine rising transitions corresponding to nine color bursts on each active video line. The output from AND gate 214 is provided to D flip-flop 216 which uses the signal to sample the phase value from NCO accumulator (NCO ACC) 412. The output from D flip-flop 216 comprises the phase difference (or phase error) between NCO 150 and the reference signal. In the exemplary embodiment, the most significant bit (MSB) of the phase value is sampled and D flip-flop 216 behaves as an early/late phase detector. The phase error from D flip-flop 216 is provided to summer 218 which accumulates the phase error for the each active video line. The output from summer 218 is provided to burst accumulator (BURST ACC) 220 which stores the value on the alternative clock edge of the output from AND gate 214 as provided by inverter 230. Burst accumulator 220 is reset to zero whenever the CBWIN signal is low. The output from burst accumulator 220 comprises the phase error which has been accumulated for all color bursts within that active video line. The output from burst accumulator 220 is provided to odd register 244, even register 246, and summer 222.

For PAL signal, the phase of the color bursts alternates over consecutive video lines. The phase of the color bursts for the "even" lines are 90 degree out of phase with the phase of the color bursts for the "odd" lines, where odd and even are designated from the set of non-repeating video frames. If the phase error accumulated for the odd and even lines are used directly, limit cycling occurs because the phase error alternates between a high value and a low value, depending on whether the video line is odd or even. The limit cycling can degrade the performance of chroma genlock circuit 170. In the exemplary embodiment, to minimize the limit cycling, the phase for each video line is stored and compared against the phase error for a similar (e.g. odd or even) prior line.

The UPDATE signal comprises a pulse for each active video line and the ODDEVEN signal alternates between high and low for odd and even lines, respectively. These signals are provided to gates 240 and 242 which provide the necessary clocking signals for odd register 244 and even register 246, respectively. Odd register 244 stores the phase error of an odd line for future reference and even register 246 stores the phase error of an even line for future reference.

The outputs from odd register 244 and even register 246 are provided to multiplexer (MUX) 248 which selects the proper output depending on the ODDEVEN signal. In the exemplary embodiment, the output from odd register 244 is provided to summer 222 when the ODDEVEN control signal is high and the output from even register 246 is provided to summer 222 when the ODDEVEN control signal is low. Summer 222 subtracts the value from MUX 248 from the value from burst accumulator 220 and provides the difference to D flip-flop 224. D flip-flop 224 stores the difference on each UPDATE pulse. The output from D flip-flop 224 is provided to summer 226 which accumulates the phase error for the current line with the phase error from previous lines. The phase error from summer 226 is provided to PD accumulator (PD ACC) 228 and stored on the next UPDATE1 pulse. In the exemplary embodiment, the UPDATE1 pulse is delayed in time with respect to the UPATE pulse. PD accumulator 268 is reset to zero whenever the PDENB signal is low. The PDENB signal is described below. The output from PD accumulator 228 comprises the output, or phase error, from phase detector 200a.

The phase detector output is provided to summer 310 within loop filter 300a. In the exemplary embodiment, loop filter 300a is a type II loop. The phase detector output is accumulated with the frequency value in PD accumulator (PD ACC) 312. PD accumulator 312 is loaded with a predetermined value by bringing the INIT signal low. This load is performed to initialize chroma genlock circuit 170 or to restart the acquisition process. In the exemplary embodiment, the predetermined value is $NCO_{freq}$, which is calculated in accordance with equation (1), divided by the indirect gain $A_i$. Thus, for NTSC signal, an indirect gain $A_i$ of $\frac{1}{8}$, and a 22-bit NCO accumulator, the predetermined value is 556,062·8. The output from summer 310 is provided to PD accumulator 312 which stores the value on the next UPDATE2 pulse. The type II loop filter implements the following transfer function:

$$H(s) = -\frac{R_2}{R_1} \frac{s + \frac{1}{R-2}C}{s} = -\left(\frac{R_2}{R_1} + \frac{1}{sR_1C}\right) = -\left(A_d + \frac{A_i}{s}\right), \quad (2)$$

where $A_d$ is the direct gain which is equal to $R_2/R_1$ and $A_i$ is the indirect gain which is equal to $1/R_1C$. The negative sign in the transfer function can be incorporated into the loop by inverting a value anywhere within the loop, such as the output of NCO accumulator 412. $R_1$, $R_2$, and C are components of a corresponding analog loop filter and determine the bandwidth and damping of the phase lock loop. The phase detector output is also provided to direct gain element ($A_d$) 316 which scales the value with the gain $A_d$. The frequency value from PD accumulator 312 is provided to indirect gain element ($A_i$) 314 which scales the value with the gain $A_i$. The output from gain elements 314 and 316 are provided to summer 318 which sums the two inputs. The resultant sum is provided to PD buffer (PD BUF) 320 which stores the value on the next UPDATE3 pulse. The control signal from buffer 320 comprises the loop filter output.

The loop filter output comprises the estimate of the instantaneous frequency of the color bursts in the video signal. The phase of the color subcarrier is obtained by accumulating the instantaneous frequency. Within NCO 150, the loop filter output is provided to summer 410 which accumulates the frequency value from loop filter 300b with the phase value from NCO accumulator 412. The output of summer 410 is stored in NCO accumulator 412. The phase value from NCO accumulator 412 is provided to color look-up table (CLUT) 160 which converts the phase value to the corresponding color subcarrier amplitude which is used within video encoder 30. The phase value from NCO accumulator 412 is also provided to D flip-flop 216 and compared against the phase of the color bursts of the analog video signal.

A diagram of the timing signals used within phase detector 200a and loop filter 300a is illustrated in FIG. 8. The generation of these signals is described below.

II. NTSC Chroma Genlock Circuit

The chroma genlock circuit shown in FIG. 5 supports both PAL and NTSC. For NTSC, the phase of the color bursts does not alternate over consecutive video lines as for PAL. Thus, the comparison of the phase error of the present odd or even line with a previous odd or even line is not necessary and the corresponding circuits can be eliminated. Therefore, the chroma genlock circuit in FIG. 5 can be simplified to that shown FIG. 6. In addition, the circuits in FIG. 6 utilize synchronous registers which are clocked with the 27 MHz clock. Synchronous circuits are the preferred circuit implementation in integrated circuit.

The COLOR BURST signal is provided to D flip-flop 252 which samples the signal with the 27 MHz clock. The output from D flip-flop 252 is provided to D flip-flop 254 which resamples the signal with the 27 MHz clock. Sampling of the COLOR BURST signal with two flip-flops removes the metastability which can result from sampling an asynchronous signal with synchronous flip-flops. The output from D flip-flop 254 is provided to D flip-flop 256 which provides one clock cycle of delay. The outputs from D flip-flops 254 and 256 are provided to gate 258 which detects a leading transition in the COLOR BURST signal. Whenever the output from D flip-flop 254 is high and the output from D flip-flop 256 is low, a low to high (or leading) transition in the COLOR BURST signal has occur and the output of gate 258 is high. The output of gate 258 is provided to D flip-flop 260 which resamples the signal. The output from D flip-flop 260 is provided to AND gate 262 which also receives the CBGATE signal. The CBGATE signal is active only during the portion of time when color bursts are present in the video signal, as shown in FIG. 8. The AND function removes extraneous edges from the COLOR BURST signal. In the exemplary embodiment, for NTSC signal, the CBPULSE signal from AND gate 262 comprises nine pulses corresponding to nine color bursts on each active video line, as shown in FIG. 8.

The output from AND gate 262 is provided to D flip-flops 264 and 270. D flip-flop 264 samples the phase value from NCO accumulator 412. This phase value is only sampled when a pulse is received at the enable (E) input of D flip-flop 264. In the exemplary embodiment, the MSB bit of the phase value is sampled by D flip-flop 264. In this manner, D flip-flop 264 behaves as an early/late phase detector. The phase error from D flip-flop 264 is provided to summer 266 which accumulates the phase error over the each active video line. The output from summer 266 is provided to PD accumulator (PD ACC) 268 which stores the value whenever a pulse is received from D flip-flop 270. In the exemplary embodiment, PD accumulator 268 is implemented with 5 bits to enable a count of ±9 for up to nine early or late color bursts from each active video line. D flip-flop 270 provides one clock cycle of delay such that the same pulse which is used to sample the phase value in D flip-flop 264 is also used to store the phase error in PD accumulator 268. PD accumulator 268 also receives the PDENB signal which is active whenever the color bursts are valid. The PDENB signal resets PD accumulator 268 to zero prior to the accumulation of the phase error at the start of each active video line. The output from PD accumulator 268 comprises the phase detector output.

The phase detector output is provided to summer 340 within loop filter 300b. Loop filter 300b provides the same functionality as loop filter 300a in FIG. 5, except loop filter 300b is implemented with synchronous circuits which are clocked with the 27 MHz clock. The phase detector output is accumulated with the frequency value in PD accumulator (PD ACC) 342. The output from summer 340 is provided to PD accumulator 342 which stores the value on the next UPDATE2 pulse. The phase detector output is also provided to direct gain element ($A_d$) 346 which scales the value with the gain $A_d$. The frequency value from PD accumulator 342 is provided to indirect gain element ($A_i$) 344 which scales the value with the gain $A_i$. The output from gain elements 344 and 346 are provided to summer 348 which sums the two inputs. The resultant sum is provided to PD buffer (PD BUF) 350 which stores the value on the next UPDATE3 pulse. The control signal from buffer 350 comprises the loop filter output. The loop filter output is provided to NCO 150 which function in the manner described above.

In the exemplary embodiment, PD accumulator 342 is implemented with 25 bits, PD buffer 350 is implemented with 22 bits, and NCO accumulator 412 is implemented with 22 bits. This provides sufficient resolution required by most video applications. However, the present invention is directed at the use of different number of bits for these registers. In the exemplary embodiment, the indirect gain $A_i$ is ⅛ and the direct gain $A_d$ is 1. These gain values affect the PLL loop bandwidth and damping. Therefore, the present invention is directed at other values for the indirect and direct gains.

Figure 6:
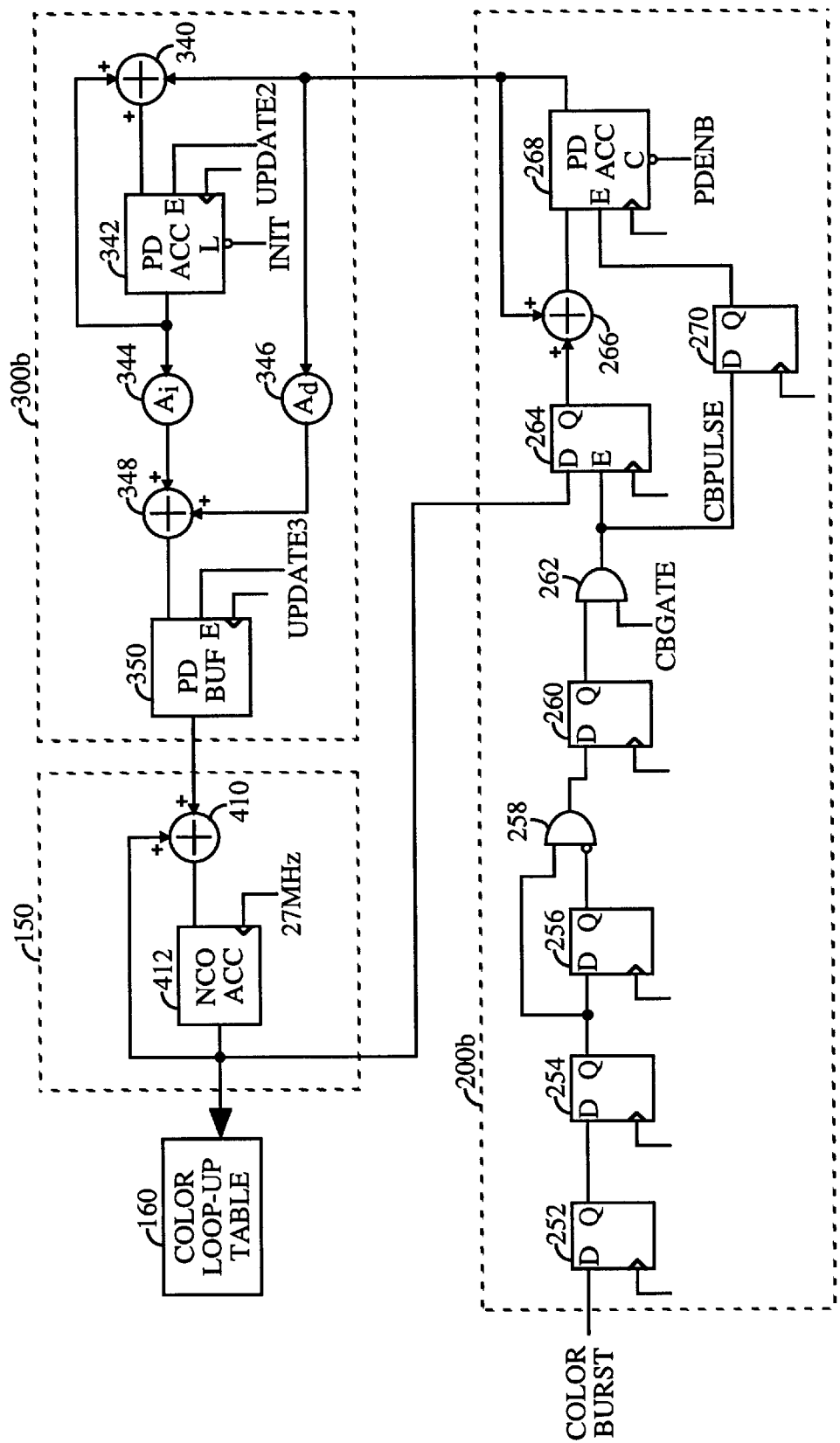
FIG. 6 is a schematic diagram of an exemplary NTSC chroma genlock circuit of the present invention.

As shown in FIG. 6, all synchronous circuits (e.g. D flip-flops, registers, and accumulators) are clocked with the 27 MHz clock. Some registers are also provided with a synchronous enable (E) input such that the output changes only when the enable input is activated (or set high). Some registers are also provided with the clear (C) or reset input which synchronously resets the register output to zero when a low signal is received. And some registers are provided with the load (L) input which synchronously loads the register output with a predetermined value when a low signal is received. These functions are known in the art.

Figure 9:
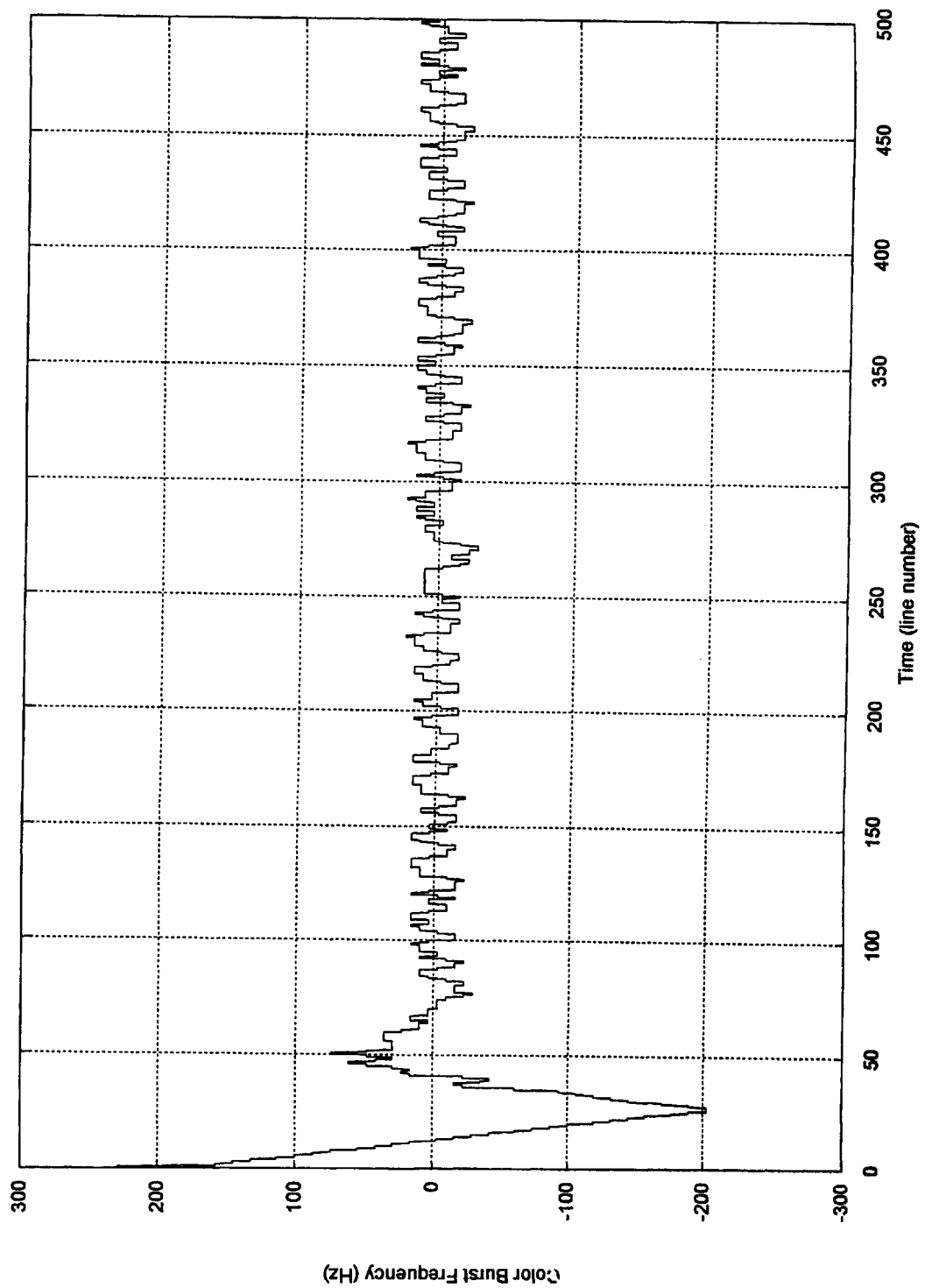
FIG. 9 is an exemplary plot of the acquisition time of the phase lock loop of the present invention.

The simulated performance of the phase lock loop of the present invention is shown in FIG. 9. For an initial offset of 300 Hz, the phase lock loop achieves lock within 75 video lines. Again, the performance can be altered by adjustments of the indirect and direct gain values. Notice the granular steps in the frequency value, or the output of loop filter 300b. The granularity can be reduced by using higher number of bits for PD accumulator 342, PD buffer 350, and NCO accumulator 412. However, for most applications, this level of granularity is acceptable.

The chroma genlock circuit in FIG. 6 can be used to lock NCO 150 to a PAL signal. Initially, the output of phase detector 200b toggles between the high and low states because of the phase alternation in the color bursts over consecutive video lines in PAL. This is the limit cycling in the output of phase detector 200b. The chroma genlock circuit is still able to achieve lock even with the limit cycling. Once phase locked, the phase from NCO accumulator 412 can be adjusted +45 degree and −45 degree depending on whether the video line is even or odd, respectively. This phase alternation in the phase value from NCO accumulator 412 is also required by video encoder 30 to generate coherent color displays.

As shown in FIGS. 5 and 6, the phase error for the color bursts in each active video line is accumulated by PD accumulators 228 and 268, respectively. The accumulation results in an additional pole within the loop. The additional pole provides additional gain at low frequency which is beneficial because of the gated nature of the loop. However, the accumulation by PD accumulators 228 and 268 can be eliminated from phase detectors 200a and 200b, respectively, without affecting the functionality of the phase lock loop of the present invention.

III. Timing Circuit

In the present invention, timing circuit 700 is used to generate the various timing signals which are utilized by chroma genlock circuit 170. Some exemplary timing signals generated by timing circuit 700 are illustrated in FIG. 8. The CBPULSE signal is generated by phase detector 200b as shown in FIG. 6. This signal is provided to timing circuit 700 which generates the CBGATE signal in response thereto. Timing circuit 700 also generates the CBWIN signal which encompasses the color bursts and the UPDATE signal which is pulsed high after the CBGATE signal has traverse low. The UPDATE1, UPDATE2, and UPDATE3 signals as used within phase detectors 200a and 200b and loop filters 300a and 300b are delayed versions of the UPDATE signal and are generated by delaying the UPDATE signal one, two, and three 27 MHz clock cycles, respectively. The HORIZONTAL SYNC signal is generated by line lock circuit 54 and comprises pulses which appear once on each video line, except during VBI where two pulses are present on each line. Timing generator 700 can be implemented using synchronous circuits and logic in a manner known in the art.

IV. Bad Color Bursts Detection

For video signal transmitted over the air, e.g. through terrestrial link 5 or satellite link 7, the quality of the received video signal can be degraded. In fact, at 0 dB carrier-to-noise C/N, the received NTSC video signal can comprise many spurious signals, causing more than nine pulses to appear on some active video lines. The extraneous pulses can dramatically degrade the performance of the chroma genlock circuit. In fact, the extraneous pulses can create a large phase error which can kick the chroma genlock circuit out of lock.

In the present invention, a detection circuit can be integrated within the phase lock loop to detect bad reference cycles within the predetermined duration when the reference signal is valid and to remove the phase error corresponding to this duration from consideration in the phase detector and loop filter. Thus, in the exemplary embodiment, chroma genlock circuit 170 can be designed with a detector circuit to detect bad color bursts and to remove these color bursts from consideration. In the exemplary embodiment, a bad color burst is declared based on the measured width of the received color burst. For NTSC, each color burst has a width of 7.54 cycles of the 27 MHz clock. The width of each received color burst is measured and compared against a first predetermined range. In the exemplary embodiment, for NTSC signal, the predetermined range is between seven and eight 27 MHz clock cycles. If the measured width of the received color burst is less than seven or greater than eight, the color burst is declared as bad and the phase error for that video line is removed from consideration within chroma genlock circuit 170. The bad color burst indication is incorporated into the PDENB signal which is shown in FIGS. 5 and 6.

Figure 7:
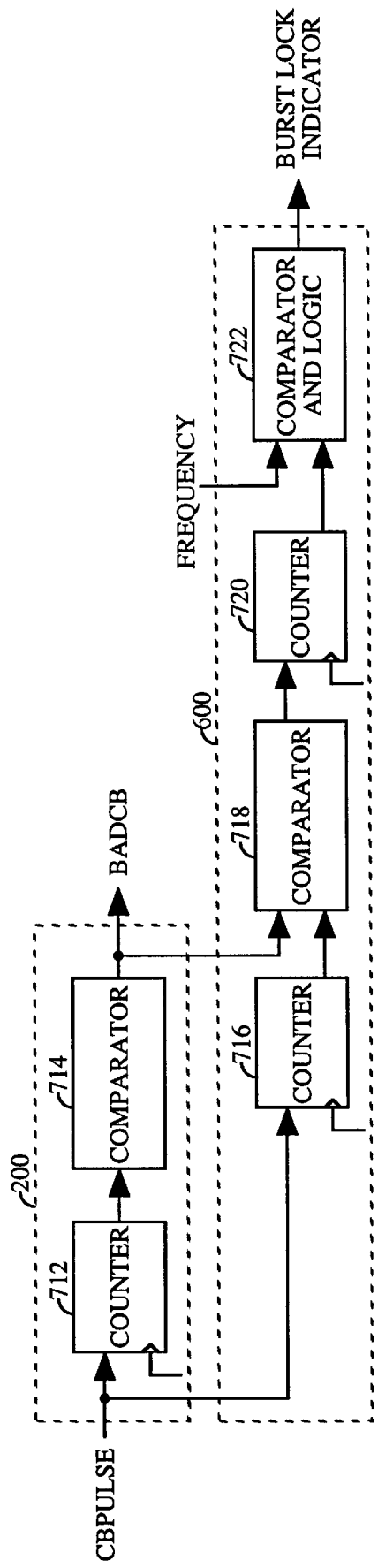
FIG. 7 is a block diagram of exemplary detection circuits for detecting bad color bursts and burst lock in the present invention.

An exemplary circuit which detects bad color bursts is shown in FIG. 7. Counter 712 receives the CBPULSE signal and is reset to zero whenever a pulse on the CBPULSE signal is received. The pulse corresponds to the zero crossing of the color burst. Counter 712 counts up for each 27 MHz clock cycle until the next pulse is detected on the CBPULSE signal. The count value from counter 712 is provided to comparator 714 and compared against the first predetermined range. If the measured width of the color burst does not fall within the predetermined range, a bad color burst is declared on the BADCB signal. In the exemplary embodiment, if at least one bad color burst is detected on a video line, the PDENB signal is set low and PD accumulators 228 and 268 are reset to zero. Thus, one bad color burst results in the phase error for that corresponding video line to be removed from consideration in the loop.

V. Lock Detection Circuit

When chroma genlock circuit 170 is locked to the video signal, the phase of NCO 150 is synchronous with the phase of the color bursts on the video signal. NCO 150 can then be used to generate color displays. However, if NCO 150 is not locked to the color bursts, the color displays generated with NCO 150 are random colored displays. In the present invention, a lock detection circuit is used to detect when color genlock circuit 170 is phase locked to the color bursts. The BURST LOCK INDICATOR can be provided to controller 26 which can use the indicator to output a color display when phase locked is achieved, or a black and white display when phase locked has not been achieved.

In the exemplary embodiment, the width of the nine color bursts of each NTSC video line is measured and compared against a second predetermined range. For NTSC signal, the nine color bursts on each active video line have a width of 67.89 cycles of the 27 MHz clock. A counter is used to measure the width of the color bursts. The counter is reset to zero by the first pulse on the CBPULSE signal of each active video line. The counter then counts up with every 27 MHz clock cycle until the ninth pulse is detected on the CBPULSE signal, or unless a bad color burst has been detected as described above. If the measured width of the nine color bursts is outside the second predetermined range, a bad burst line is declared. For each video frame, the number of bad burst lines is accumulated and compared against a predetermined threshold. If the number of bad burst lines exceeds the threshold, the BURST LOCK INDICATOR is brought low.

Referring to FIG. 8, for NTSC signal, CBGATE is high for nine pulses in the CBPULSE signal. The width of CBGATE is measured and used as the width of the nine color bursts. Notice that the ninth pulse in CBPULSE occurs at the start of the ninth color burst. Thus, the nine pulses on each active video line has a nominal width of 61.35 cycles of the 27 MHz clock (67.89 clock cycles–6.54 clock cycles for the ninth color burst). Therefore, the second predetermined range is set accordingly. In the exemplary embodiment, the second predetermined range is 57 to 63. In the presence of noise, extraneous pulses are generated and rarely is a pulse removed. This fact is reflected in the asymmetry of the second predetermined range.

An exemplary block diagram of lock detection circuit 600 used to detect burst lock is shown in FIG. 7. Counter 716 receives the CBPULSE signal and is reset to zero by the first pulse on the CBPULSE signal of each active video line. Counter 716 counts up with each 27 MHz clock cycle until the ninth pulse is detected on the CBPULSE signal. The count value from counter 716 is provided to comparator 718 and compared against the second predetermined range. If the measured width of the color bursts does not fall within the second predetermined range, a bad burst line is declared. The bad burst line indication is provided to counter 720 which counts the number of bad burst lines for each video frame. Counter 720 is reset during the VBI portion and counts up whenever a bad burst line is indicated. The value from counter 720 is provided to comparator and logic 722 which compares the number of bad burst lines with the predetermined threshold. In the exemplary embodiment, for NTSC signal, the predetermined threshold is 48. If the number of bad color burst line exceeds the threshold, the BURST LOCK INDICATOR is brought low to indicate an out-of-lock condition. In the exemplary embodiment, comparator and logic 722 also receives the frequency value from PD buffer 320 or 350 which is indicative of the frequency of the NCO. This frequency value is compared against a third predetermined range. If the frequency value falls outside the range, the BURST LOCK INDICATOR is also brought low to indicate an out-of-lock condition. In the exemplary embodiment, for NTSC signal, the third predetermined range is 556,007 to 556,119.

The BURST LOCK INDICATOR is provided to controller 26 which can reset chroma genlock circuit 170, restart the acquisition process (e.g. sweep NCO 150), or modify the transfer function of loop filter 300 {e.g. modify equation (2)} in response thereto. For example, controller 26 can adjust the direct gain $A_d$ and/or indirect gain $A_i$ to adjust the loop bandwidth and damping. Controller 26 can widen the loop bandwidth during acquisition to improve the acquisition time and can narrow the loop bandwidth once burst lock has been achieved to improve the phase noise or phase jitter characteristics.

VI. Summary

In the present invention, the reference signal can comprise sinusoids, such as the color bursts described above, or other waveforms. Thus, reference signal can comprise square, triangular, sawtooth, or sinusoidal waveforms, or any combination thereof. One cycle of these waveforms is referred to as a reference cycle in this specification.

The present invention can operate on a non-continuous reference signal which is valid for predetermined durations at predefined locations in time, such as a video signal. Although the present invention has been described in the context of the a chroma genlock circuit used to lock an NCO to the color bursts of a video signal, the present invention can be practiced in many applications wherein the reference signal exists in a non-continuous manner. Such applications include communication systems which transmit a pilot or control signal in bursts and digital systems which send training pulses or sequences periodically.

In addition, the present invention can be applied to a continuous reference signal which is valid at all times. The predetermined durations can be set to any width and the predetermined interval (e.g. a video frame) which comprises a number of predetermined durations can also be set to any width. In fact, these two parameters can be set in accordance with the characteristics of the reference signal. Thus, the application of the present invention to various systems can be contemplated and are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A phase lock loop for locking a synthesized signal to a reference signal comprising:

a phase detector having a first input to receive said synthesized signal and a second input to receive said reference signal, said phase detector providing a phase error between said synthesized signal and said reference signal;

a loop filter coupled to said phase detector, said loop filter receiving said phase error and filtering said phase error to provide a control signal, wherein a phase of said synthesized signal is adjusted in accordance with said control signal; and a control circuit coupled to said loop filter, said control circuit providing an enable signal that enables said loop filter for predetermined periods during which said reference signal includes phase information.

2. The phase lock loop of claim 1 further comprising:

a numerically controlled oscillator that generates said synthesized signal.

3. The phase lock loop of claim 1 wherein said phase error is based on zero crossings of said reference signal.

4. The phase lock loop of claim 1 wherein said phase error is based on a difference between a phase error of a current predetermined period and a phase error of a previous predetermined period.

5. The phase lock loop of claim 1 wherein said phase error is based on a sign of said phase of said synthesized signal.

6. A phase lock loop for locking a synthesized signal from a numerically controlled oscillator to a reference signal, wherein said reference signal is valid for predetermined durations, said phase lock loop comprising:

a phase detector coupled to said numerically controlled oscillator, said phase detector receiving said synthesized signal and said reference signal and providing a phase error between said synthesized signal and said reference signal; and a loop filter coupled to said phase detector, said loop filter receiving said phase error and filtering said phase error to provide a control signal, wherein a phase of said synthesized signal is adjusted in accordance with said control signal, wherein said phase detector detects a phase difference between said synthesized signal and said reference signal for each reference cycle, and wherein said phase error is based on an accumulation of phase differences detected within each of said predetermined durations.

7. A phase lock loop for locking a synthesized signal from a numerically controlled oscillator to a reference signal, wherein said reference signal is valid for predetermined durations, said phase lock loop comprising:

a phase detector coupled to said numerically controlled oscillator, said phase detector receiving said synthesized signal and said reference signal and providing a phase error between said synthesized signal and said reference signal; and a loop filter coupled to said phase detector, said loop filter receiving said phase error and filtering said phase error to provide a control signal, wherein a phase of said synthesized signal is adjusted in accordance with said control signal, wherein said phase detector comprises a detector for detecting invalid reference cycles within said predetermined durations, and wherein said phase detector and said loop filter are responsive to said detection of said invalid reference cycles.

8. The phase lock loop of claim 7 wherein said detection of said invalid reference cycles is based on a measured width of a reference cycle.

9. The phase lock loop of claim 8 wherein said measured width of said reference cycle is compared against a predetermined range, and wherein an invalid reference cycle is detected if said measured width of said reference cycle falls outside said predetermined range.

10. The phase lock loop of claim 9 wherein said loop filter ignores said phase error for a particular predetermined duration if at least one invalid reference cycle is detected within said particular predetermined duration.

11. The phase lock loop of claim 1 wherein said loop filter is initialized with a value based on a frequency of said reference signal.

12. The phase lock loop of claim 1 further comprising:

a lock indicator coupled to said loop filter, said lock detector providing an indication of lock of said phase lock loop, wherein a transfer function of said loop filter is modified in accordance with said indication of lock from said lock indicator.

13. The phase lock loop of claim 12 wherein said transfer function of said loop filter is modified by adjusting a direct gain or an indirect gain within said loop filter.

14. A phase lock loop for locking a synthesized signal from a numerically controlled oscillator to a reference signal, wherein said reference signal is valid for predetermined periods, said phase lock loop comprising:

a phase detector coupled to said numerically controlled oscillator, said phase detector receiving said synthesized signal and said reference signal and providing a phase error between said synthesized signal and said reference signal;

a loop filter coupled to said phase detector, said loop filter receiving said phase error and filtering said phase error to provide a control signal, wherein a phase of said synthesized signal is adjusted in accordance with said control signal; and a lock detector coupled to said phase detector and said loop filter, said lock detector detecting an out-of-lock condition based on measured widths of said predetermined periods.

15. The phase lock loop of claim 14 wherein said measured widths of said predetermined periods are each compared against a predetermined range, and wherein an invalid reference period is declared if said measured width falls outside said predetermined range.

16. The phase lock loop of claim 15 wherein said measured widths of said predetermined periods are each based on counting a number of reference cycles within a predetermined period.

17. The phase lock loop of claim 15 wherein said out-of-lock condition is declared if a number of invalid reference periods within a predetermined interval exceeds a predetermined threshold.

18. The phase lock loop of claim 14 wherein said out-of-lock condition is declared if a magnitude of said control signal falls outside a predetermined range.

19. The phase lock loop of claim 1 further comprising:

a look-up table coupled to said numerically controlled oscillator, said look-up table receiving said phase of said synthesized signal and providing an amplitude value in response thereto.

20. The phase lock loop of claim 1 wherein said reference signal is a video signal.

21. The phase lock loop of claim 1 wherein said video signal conforms to NTSC format.

22. A phase lock loop for locking a synthesized signal to a reference signal comprising:

a numerically controlled oscillator that generates said synthesized signal;

a phase detector coupled to said numerically controlled oscillator, said phase detector receiving said synthesized signal and said reference signal and providing a phase error;

a loop filter coupled to said phase detector, said loop filter receiving said phase error and filtering said phase error to provide a control signal; and wherein a phase of said synthesized signal is adjusted in accordance with said control signal, and wherein said loop filter is enabled for predetermined periods when said reference signal includes phase information.

23. An apparatus for locking a synthesized signal to a reference signal, wherein said reference signal is valid for predetermined durations, said apparatus comprising:

phase detection means for detecting a phase error between said synthesized signal and said reference signal;

loop filter means for filtering said phase error and providing a control signal; and control circuit means for providing an enable signal that enables said loop filter means during said predetermined durations, wherein a phase of said synthesized signal is adjusted in accordance to said control signal.

24. The apparatus of claim 23 further comprising:

detection means for detecting invalid reference cycles within said predetermined durations, wherein said phase detection means and said loop filter means are responsive to detection of said invalid reference cycles.

25. The apparatus of claim 23 further comprising:

lock detection means for detecting an out-of-lock condition based on a measured width of a predetermined duration.

26. A method for phase locking a synthesized signal from a numerically controlled oscillator to a reference signal, wherein said reference signal is valid for predetermined durations, said method comprising:

detecting a phase error between said synthesized signal from said numerically controlled oscillator and said reference signal;

filtering said phase error to provide a control signal;

adjusting a phase of said synthesized signal in accordance with said control signal; and enabling said filtering for said predetermined durations.

27. The method of claim 26 further comprising:

detecting invalid reference cycles within said predetermined durations, and wherein said detecting and said filtering are responsive to detection of said invalid reference cycles.

28. The method of claim 26 further comprising:

detecting an out-of-lock condition based on measured widths of said predetermined durations.

* * * * *